United States Patent
Yi et al.

(10) Patent No.: US 6,292,410 B1
(45) Date of Patent: Sep. 18, 2001

(54) APPARATUS FOR BUFFERING DATA STROBE SIGNAL IN HIGH-SPEED MEMORY DEVICE

(75) Inventors: Seung-Hyun Yi; Min-Ho Yoon, both of Ichon-shi (KR)

(73) Assignee: Kyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/427,698

(22) Filed: Oct. 27, 1999

(30) Foreign Application Priority Data

Oct. 28, 1998 (KR) .................................................. 98-45298

(51) Int. Cl.[7] ..................................................... G11C 7/00
(52) U.S. Cl. ............... 365/193; 365/189.05; 365/230.08; 365/233; 365/194
(58) Field of Search ............................. 365/193, 189.05, 365/230.08, 233, 194

(56) References Cited

U.S. PATENT DOCUMENTS

| | | | |
|---|---|---|---|
| 6,064,625 | * | 5/2000 | Tomita .................................. 365/233 |
| 6,078,546 | * | 6/2000 | Lee ....................................... 365/233 |
| 6,151,272 | * | 11/2000 | La et al. .............................. 365/233 |

* cited by examiner

*Primary Examiner*—David Nelms
*Assistant Examiner*—Connie C. Yoha
(74) *Attorney, Agent, or Firm*—Jacobson Holman, PLLC

(57) ABSTRACT

An apparatus for receiving an external data strobe signal in a high-speed memory device to generate an internal data strobe signal used in a write operation therein, includes first buffering means, activated by an enable signal, for receiving the external data strobe signal having a series of pulses to output a first internal data strobe signal having a series of pulses, each pulse of the first internal data strobe signal corresponding to a rising edge of each pulse of the external data strobe signal, and second buffering means, activated by the enable signal, for receiving the external data strobe signal having a series of pulses to output a second internal data strobe signal having a series of pulses, each pulse of the second internal data strobe signal corresponding to a falling edge of each pulse of the external data strobe signal, wherein a delay to a corresponding pulse of the first internal data strobe signal from a rising edge of each pulse of the external data strobe signal is substantially identical to a delay to a corresponding pulse of the second internal data strobe signal from a falling edge of each pulses of the external data strobe signal.

17 Claims, 3 Drawing Sheets

APPARATUS FOR BUFFERING DATA STROBE SIGNAL IN HIGH-SPEED MEMORY DEVICE

FIELD OF THE INVENTION

The present invention relates to an apparatus for receiving an external data strobe signal in a high-speed memory device to generate internal data strobe signals used in a write operation therein, capable of preventing an erroneous operation thereof and obtaining a sufficient operating margin.

DESCRIPTION OF THE PRIOR ART

As is well known those skilled in the art, a synchronous dynamic random access memory (SDRAM) is widely used for improving an operating speed. The SDRAM operates at high speed under synchronization of a system clock inputted from an external DRAM controller, wherein the system clock is also called a data strobe signal. The typical SDRAM employs pulse signals which are synchronized on a rising edge of the data strobe signal. On the other hand, Double Data Rate SDRAM (hereinafter, referred to as DDR SDRAM) employs two kinds of pulse signals which are respectively synchronized on a rising edge and a falling edge of the data strobe signal, so that it supplies a more high-speed operating speed than the typical SDRAM. Therefore, the DDR SDRAM requires two kinds of apparatus (hereinafter, referred to as a data strobe buffer) for generating the pulse signals which are respectively synchronized on the falling edge as well as a rising edge of the data strobe signal.

Since each apparatus has a different circuit configuration each other, however, each delay time may also be different from each other, so that a different time shift occurs on the rising and falling edges of the data strobe signal. Therefore, it is difficult to obtain a sufficient operation margin. Further, in section "A" shown in FIG. 1, undesirable pulse signals should be prevented from being generated at a point when an enable signal EN for enabling the data strobe buffer is activated.

SUMMARY OF THE INVENTION

It is, therefore, an object of the present invention to provide an apparatus for an apparatus for receiving an external data strobe signal to generate an internal data strobe signal in a high-speed memory device, thereby being capable of preventing an erroneous operation thereof and obtaining a sufficient operating margin.

In accordance with an embodiment of the present invention, there is provided an apparatus for receiving an external data strobe signal in a high-speed memory device to generate an internal data strobe signal used in a write operation therein, comprising: first buffering means, activated by an enable signal, for receiving the external data strobe signal having a series of pulses to output a first internal data strobe signal having a series of pulses, each pulse of the first internal data strobe signal corresponding to a rising edge of each pulse of the external data strobe signal; and second buffering means, activated by the enable signal, for receiving the external data strobe signal having a series of pulses to output a second internal data strobe signal having a series of pulses, each pulse of the second internal data strobe signal corresponding to a falling edge of each pulse of the external data strobe signal, wherein a delay to a corresponding pulse of the first internal data strobe signal from a rising edge of each pulse of the external data strobe signal is substantially identical to a delay to a corresponding pulse of the second internal data strobe signal from a falling edge of each pulses of the external data strobe signal.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
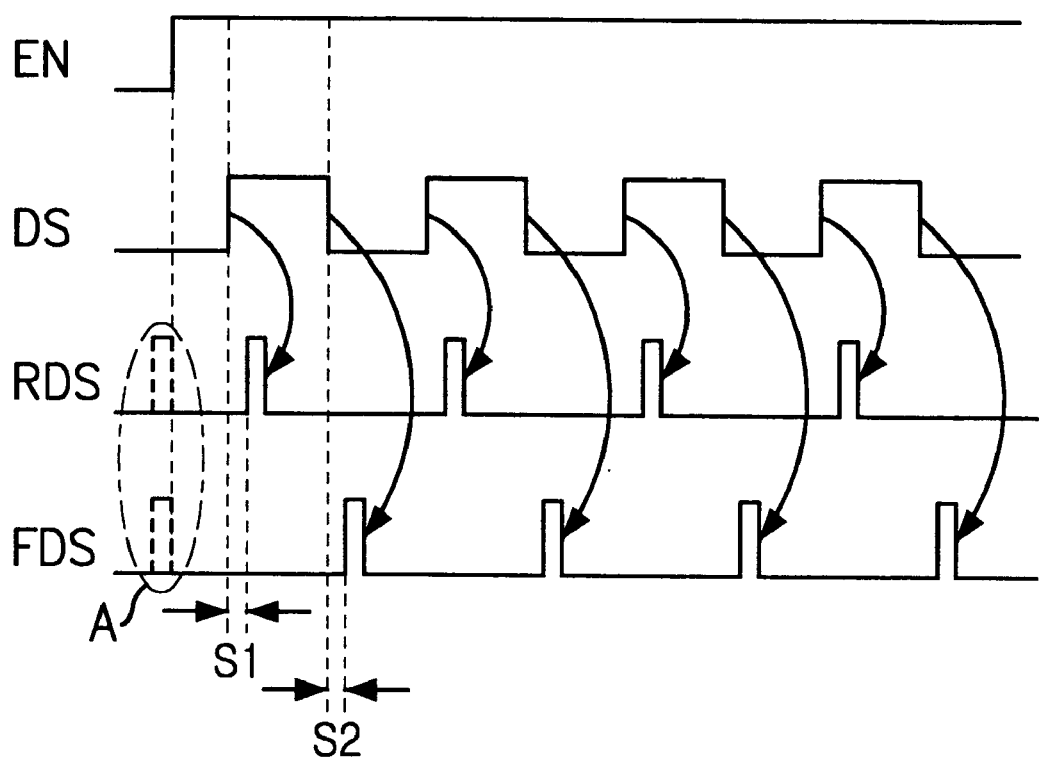
FIG. 1 is a timing chart illustrating pulse signals synchronized on rising edge and falling edge of a data strobe signal.

FIG. 1 is a timing chart illustrating pulse signals synchronized on rising and falling edges of a data strobe signal. A reference numeral EN denotes an enable signal for enabling a data strobe buffer, DS an external data strobe signal, RDS a first internal data strobe signal which is a series of pulses corresponding to a rising edge of each pulse of the external data strobe signal DS, and FDS a second internal data strobe signal which is a series of pulses corresponding to a falling edge of each pulse of the external data strobe signal DS.

Figure 2:
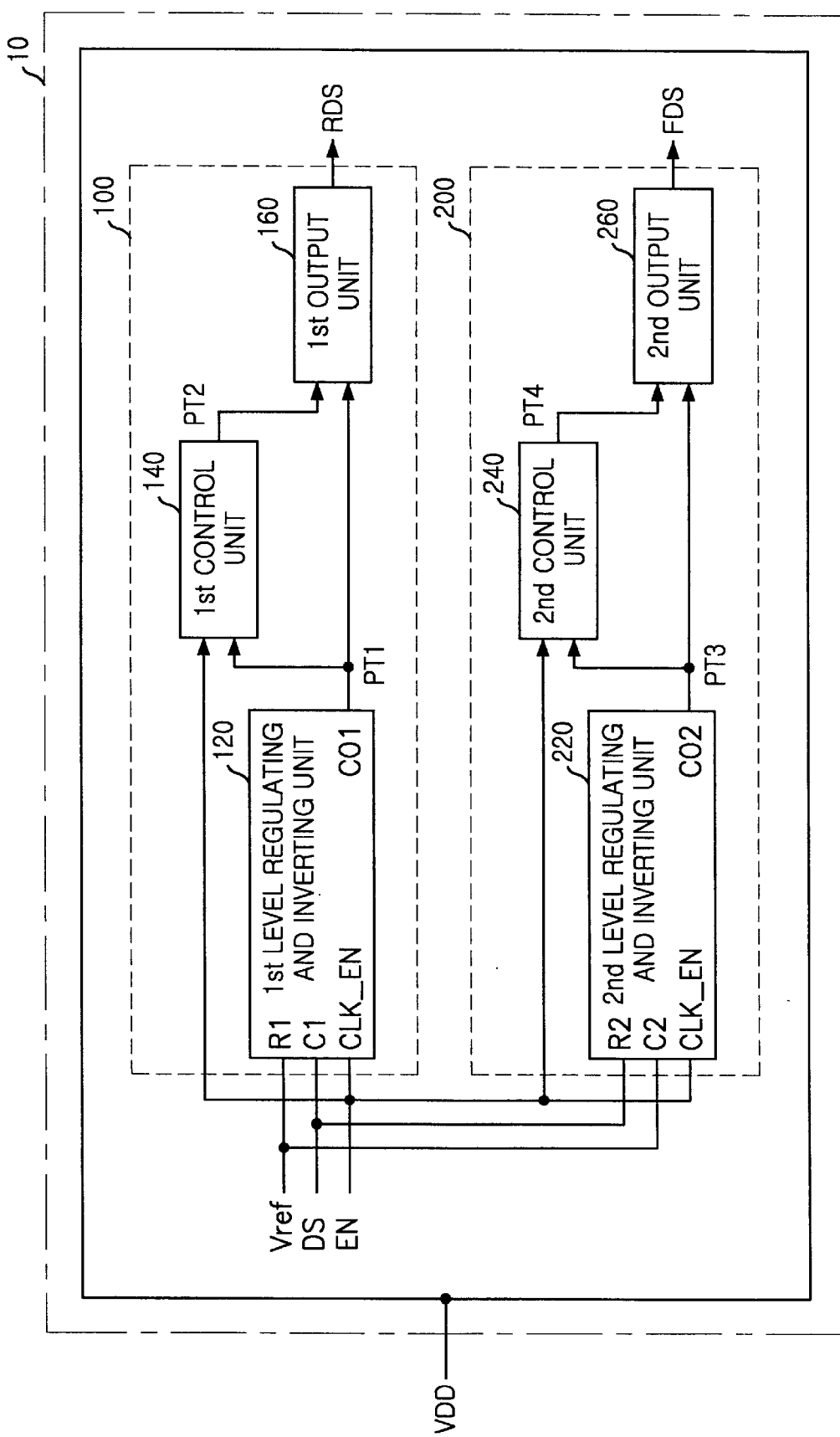
FIG. 2 is a block diagram illustrating a data strobe buffer in accordance with the present invention.

FIG. 2 is a block diagram illustrating a data strobe buffer in accordance with the present invention. The data strobe buffer 10 is an apparatus for receiving an external data strobe signal to generate an internal data strobe signal used in a write operation. As shown in FIG. 2, the data, strobe buffer 10 includes a first buffering unit 100 and a second buffering unit 200.

When the enable signal EN is in a active state, the first buffering unit 100 receives the external data strobe signal DS and outputs a first internal data strobe signal RDS having a series of pulses, wherein each pulse of the first internal data strobe signal RDS corresponds to a rising edge of each pulse of the external data strobe signal DS. In similar manner, when the enable signal EN is in an active state, the second buffering unit 200 receives the external data strobe signal DS and outputs a second internal data strobe signal FDS having a series of pulses, wherein each pulse of the second internal data strobe signal FDS corresponds to a falling edge of each pulse of the external data strobe signal DS.

The first buffering unit 100 includes a first level regulating and inverting unit 120, a first control unit 140 and a first output unit 160.

The first level regulating and inverting unit 120, activated in response with the enable signal EN, receives a reference voltage $V_{ref}$ and the external data strobe signal DS to output a first level regulated and inverted data strobe signal PT1, wherein the reference voltage $V_{ref}$ is a predetermined voltage or a waveform of clock. The first control means receives the enable signal EN and the first level regulated and inverted data strobe PT1 to generate a starting controlled data strobe signal PT2, wherein the first starting controlled data strobe signal PT2 corresponds to an. inverted and shifted signal of the first level regulated ancl inverted data strobe signal PT1 to a predetermined delay. The first output means receives the first level regulated and inverted data strobe signal PT1 and the first starting controlled data strobe signal PT2 to generate the first internal data strobe signal RDS.

In similar manner, the second buffering unit 200 includes a second level regulating and inverting unit 220, a second control unit 240 and a second output unit 260.

A configuration of the second buffering unit 200 is equal to that of the first buffering unit 100. That is, the second buffering unit 200 has the same configuration as the first buffering unit 100 and the first and the second buffering units 100 and 200 are simultaneously integrated with elements having the same device characteristics. Therefore, a delay of the first internal data strobe signal RDS is substantially identical to that of the second internal data strobe FDS.

On the other hand, only difference is that the reference voltage $V_{ref}$ and the external data strobe signal DS are inputted opposite to the first buffering unit 100. Therefore, the second buffering unit 200 generates the second internal data strobe signal FDS.

Figure 3:
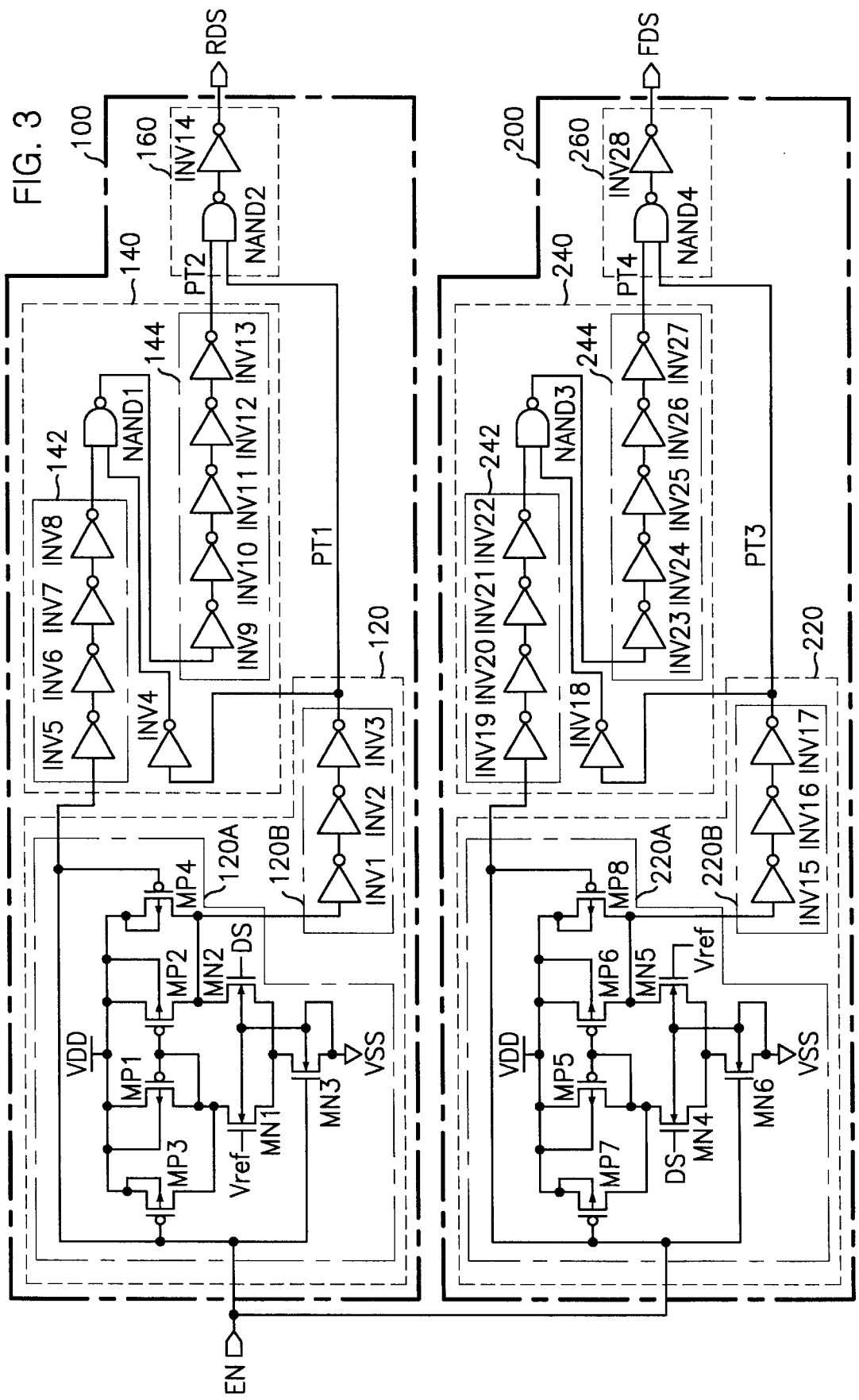
FIG. 3 is a circuit diagram illustrating a data strobe buffer in accordance with an embodiment of the present invention.

FIG. 3 is a circuit diagram illustrating a data strobe buffer in accordance with an embodiment of the present invention. The same reference numerals used in FIG. 2 are again used in the portions corresponding to each unit shown in FIG. 3.

Referring to FIG. 3, the first buffering means includes a first level regulating and inverting unit 120, a first control unit 140 and a first output unit 160.

The first level regulating and inverting unit 120 includes a differential amplifier 120A for receiving the reference voltage $V_{ref}$ and the external data strobe signal DS to output an amplified signal as a first level regulated signal, and an inverting unit 120B for inverting the amplified signal and outputting the first level regulated and inverted data strobe signal PT1.

The differential amplifier 120A includes a pair of PMOS transistors MP1 and MP2, a pair of NMOS transistors NM1 and NM2, an NMOS transistor NM3, and PMOS transistors MP3 and MP4. The pair of PMOS transistors MP1 and MP2 have source terminals connected to a voltage source VDD and gate terminals commonly connected at a first node, wherein the voltage source VDD is applied to each substrate of the PMOS transistors MP1 and MP2. The pair of NMOS transistors MN1 and MN2 have drain terminals respectively connected to drain terminals of the pair of the PMOS transistors MP1 and MP2, source terminals commonly connected at a second node, and gate terminals receives the reference voltage $V_{ref}$ and the external data strobe signal DS, respectively. The NMOS transistor MN3 is connected between the second node and a ground GND, whose gate terminal receives the enable signal EN and whose substrate is connected to the ground GND. Additionally, the PMOS transistor MP3 has source terminal connected to the voltage source VDD, drain terminal connected to a third node between the PMOS transistor MP1 and the NMOS transistor MN1, and gate terminal receiving the enable signal EN, wherein the voltage source VDD is applied to its substrate. The PMOS transistor MP4 has source terminal connected to the voltage source VDD, drain terminal connected to a fourth node between the PMOS transistor MP2 and the NMOS transistor MN2, and gate terminal receiving the enable signal EN, wherein the voltage source VDD is applied to its substrate.

The inverting unit 120B includes a plurality of inverters INV1 to INV3 connected in series.

The first control unit 140 includes a first delaying unit 142 for delaying the enable signal EN, wherein the first delaying unit 142 includes a plurality of inverters INV5 to INV8 connected in series, a first inverter INV4 for inverting the first level regulated and inverted data strobe signal PT1, a first NAND gate NAND1 for NANDing the inverted first level regulated and inverted data strobe signal and the delayed enabled signal, and a first inverting and delaying unit 144 for inverting and delaying the output signal of the first NAND gate NAND1 to output a first starting controlled data strobe signal PT2, wherein the first inverting and delaying unit 144 includes a plurality of inverters INV9 to INV13.

The first output unit 160 includes a second NAND gate NAND2 for NANDing the first level regulated and inverted data strobe signal PT1 and the first starting controlled data strobe signal PT2, and a second inverter INV14 for inverting the output signal of the second NAND gate NAND 2 to output the first internal data strobe signal RDS.

The second buffering unit 200 includes a second level regulating and inverting unit 220, a second control unit 240 and a second output unit 260.

A circuit configuration of the second buffering unit 200 is equal to that of the first buffering unit 100. On the other hand, the reference voltage $V_{ref}$ is inputted to an NMOS transistor MN5 corresponding to the NMOS transistor MN2 of the first buffering unit 100, and the external data strobe signal DS is inputted to an NMOS transistor MN4 corresponding to the NMOS transistor MN1 of the first buffering unit 100. Therefore, the second output unit 260 outputs the second internal data strobe signal FDS.

The operation of the data strobe buffer will be described below with reference to FIG. 3.

In case where the data strobe signal DS is greater than the reference voltage $V_{ref}$, the first level regulated and inverted data strobe signal PT1 becomes a high level and the first output unit 160 outputs a high pulse signal during a predetermined period determined by the second delaying unit 144. Thus, the first internal data strobe signal RDS synchronized on the rising edge of the data strobe signal DS is generated.

Compared with the first buffering unit 100, the reference voltage $V_{ref}$ and the data strobe signal DS are inputted opposite to the second buffering unit 200, thus the second, internal data strobe signal FDS synchronized on the falling edge of the data strobe signal DS is generated.

Additionally, when the enable signal EN is in inactive state, the first starting controlled data strobe signal PT2 keeps on a low level state for a predetermined period due to the second delaying unit 144, so that the first internal data strobe signal RDS keeps a low level state as an initial value. Even when the enable signal EN becomes activated and the first level regulated and inverted data strobe signal PT1 becomes a high level due to an erroneous operation, the first internal data strobe RDS signal keeps a low level during a predetermined period due to the first and the second delaying units 142 and 144. Therefore, the erroneous operation of the data strobe buffer 10 can be effectively prevented.

In addition, since the circuit configuration is equal to each other, a delay (S1, in FIG. 1) to a corresponding pulse of the first internal data strobe signal RDS from a rising edge of each pulse of the external data strobe signal is substantially identical to a delay (S2, in FIG. 1) to a corresponding pulse of the second internal data strobe signal FDS from a falling edge of each pulses of the external data strobe signal. Therefore, it is unnecessary to consider a difference of delay between the first and second internal data strobe signals RDS and FDS, thereby securing a sufficient operating margin.

While the present invention has been described with respect to certain preferred embodiments only, other modifications and variation may be made without departing from the spirit and scope of the present invention as set forth in the following claims.

What is claimed is:

1. An apparatus for receiving an external data strobe signal in a high-speed memory device to generate internal data strobe signals used in a write operation therein, comprising:

first buffering means, activated by an enable signal, for receiving the external data strobe signal having a series of pulses to output a first internal data strobe signal having a series of pulses, each pulse of the first internal data strobe signal corresponding to a rising edge of each pulse of the external data strobe signal, wherein the first buffering means includes a first delay means for delaying the enable signal in order to generate the first internal data strobe signal; and second buffering means, activated by the enable signal, for receiving the external data strobe signal having a series of pulses to output a second internal data strobe signal having a series of pulses, each pulse of the second internal data strobe signal corresponding to a falling edge of each pulse of the external data strobe signal, wherein the second buffering means includes a second delay means for delaying the enable signal in order to generate the second internal data strobe signal and wherein a delay to a corresponding pulse of the first internal data strobe signal from a rising edge of each pulse of the external data strobe signal is substantially identical to a delay to a corresponding pulse of the second internal data strobe signal from a falling edge of each pulse of the external data strobe signal.

2. The apparatus as recited in claim 1, wherein said first buffering means includes:

first level regulating and inverting means, activated by the enable signal, for receiving a reference voltage and the external data strobe signal to output a first level regulated and inverted data strobe signal;

first control means for receiving the enable signal and the first level regulated and inverted data strobe signal to generate a first starting controlled data strobe signal; and first output means for receiving the first level regulated and inverted data strobe signal and the first starting controlled data strobe signal to generate the first internal data strobe signal.

3. The apparatus as recited in claim 1, wherein said second buffering means includes:

second level regulating and inverting means, activated by the enable signal, for receiving a reference voltage and the external data strobe signal to output a second level regulated and inverted data strobe signal;

second control means for receiving the enable signal and the second level regulated and inverted data strobe signal to generate a second starting controlled data strobe signal; and second output means for receiving the second level regulated and inverted data strobe signal and the second starting controlled data strobe signal to generate the second internal data strobe signal.

4. The apparatus as recited in claim 2, wherein said first level regulating and inverting means includes:

first differential amplifier for receiving the reference voltage and the external data strobe signal to output an amplified signal as a first level regulated signal; and first inverting means for inverting the amplified signal and outputting the first level regulated and inverted data strobe signal.

5. The apparatus as recited in claim 4, wherein said differential amplifier includes:

pair of first PMOS transistors, each of whose source terminal is connected to a voltage source and each of whose gate terminal commonly connected at a first node, wherein the voltage source is applied to each substrate of the PMOS transistors;

pair of first NMOS transistors, each of whose drain terminals is respectively connected to each drain terminal of the pair of the first PMOS transistors, each of whose source terminals is commonly connected at a second node, and each of whose gate terminals receives the reference voltage and the external data strobe signal, respectively;

second NMOS transistor connected between the second node and a ground, whose gate terminal receives the enable signal and whose substrate is connected to the ground;

second PMOS transistor, whose source terminal is connected to the voltage source VDD, whose drain terminal is connected to a third node between one of the pair of the first PMOS transistors and one of the pair of the first NMOS transistors, and whose gate terminal receives the enable signal, the voltage source being applied to its substrate; and third PMOS transistor, whose source terminal is connected to the voltage source, whose drain terminal is connected to a fourth node between the other of the pair of the first PMOS transistor and the other of the pair of the first NMOS transistors, and whose gate terminal receives the enable signal, the voltage source being applied to its substrate.

6. The apparatus as recited in claim 4, wherein said first inverting means includes a plurality of inverters.

7. The apparatus as recited in claim 2, wherein said first control means includes:

first delaying unit for delaying the enable signal;

first inverter for inverting the first level regulated and inverted data strobe signal;

first NAND gate for NANDing the inverted first level regulated and inverted data strobe signal and the delayed enabled signal; and first inverting and delaying means for inverting and delaying the output signal of the first NAND gate to output the first starting controlled data strobe signal.

8. The apparatus as recited in claim 7, wherein said first delaying means includes a plurality of inverters.

9. The apparatus as recited in claim 7, wherein said first inverting and delaying means includes a plurality of inverters.

10. The apparatus as recited in 2, wherein said output means includes:

second NAND gate for NANDing the level regulated and inverted data strobe signal and the first starting controlled data strobe signal; and second inverter for inverting the output signal of said second NAND gate to output the first internal data strobe signal.

11. The apparatus as recited in claim 3, wherein said second level regulating and inverting means includes:

second differential amplifier for receiving the reference voltage and the external data strobe signal to output a second level regulated signal; and second inverting means for inverting the second level regulated signal and outputting the second level regulated and inverted data strobe signal.

12. The apparatus as recited in claim 11, wherein said second differential amplifier includes:

a pair of fourth PMOS transistors, each of whose source terminals is connected to a voltage source and each of whose gate terminals commonly connected at a fifth node, wherein the voltage source is applied to each substrate of the pair of the fourth PMOS transistors;

a pair of third NMOS transistors, each of whose drain terminals is respectively connected to each drain terminal of the pair of the fourth PMOS transistors, each of whose source terminals is commonly connected at a sixth node, and each of whose gate terminals of the pair of the third NMOS transistors receives the external data strobe and the reference voltage, respectively;

fourth NMOS transistor, connected between the sixth node and a ground, whose gate terminal receives the enable signal and whose substrate is connected to the ground;

fifth PMOS transistor, whose source terminal is connected to the voltage source, whose drain terminal is connected to a seventh node between one of the pair of the fourth PMOS transistors and one of the pair of the third NMOS transistor, and whose gate terminal receives the enable signal, the voltage source being applied to its substrate; and sixth PMOS transistor, whose source terminal is connected to the voltage source, whose drain terminal is connected to a eighth node between the other of the pair of the fourth PMOS transistors and the other of the pair of the third NMOS transistors, and whose gate terminal receives the enable signal, the voltage source being applied to its substrate.

13. The apparatus as recited in claim 11, wherein said second inverting means includes a plurality of inverters.

14. The apparatus as recited in claim 3, wherein said second control means includes:
    second delaying unit for delaying the enable signal;
    third inverter for inverting the second level regulated and inverted data strobe signal;
    third NAND gate for NANDing the inverted second level regulated and inverted data strobe signal and the delayed enabled signal; and
    second inverting and delaying means for inverting and delaying the output signal of the third NAND gate to output second starting controlled data strobe signal.

15. The apparatus as recited in claim 14, wherein said second delaying means includes a plurality of inverters.

16. The apparatus as recited in claim 14, wherein the second inverting and delaying means includes a plurality of inverters.

17. The apparatus as recited in 3, wherein said second output means includes:
    fourth NAND gate for NANDing the second level regulated and inverted data strobe signal and the second starting controlled data strobe signal; and
    fourth inverter for inverting the output signal of said fourth NAND gate to output the second internal data strobe signal.

\* \* \* \* \*